United States Patent [19]
Kohlhase et al.

[11] Patent Number: 4,865,713
[45] Date of Patent: Sep. 12, 1989

[54] APPARATUS FOR APPLYING THIN LAYERS ONTO A SUBSTRATE

[75] Inventors: Armin Kohlhase, Munich; Georg Birkmaier, Ebersberg; Friedrich Wienerroither, Munich, all of Fed. Rep. of Germany

[73] Assignee: Siemens Aktiengesellschaft, Berlin and Munich, Fed. Rep. of Germany

[21] Appl. No.: 185,453

[22] Filed: Apr. 25, 1988

[30] Foreign Application Priority Data

May 26, 1987 [DE] Fed. Rep. of Germany ....... 3717764

[51] Int. Cl.$^4$ .......................................... C23C 14/34
[52] U.S. Cl. ................................. 204/298; 204/192.12
[58] Field of Search ........... 204/192.1, 192.12, 192.15, 204/298, 298 R, 298 C, 298 MT, 298 GF, 298 MC, 298 MD, 298 E, 298 ET, 298 EG, 298 EM; 118/719; 414/217, 222, 227, 232

[56] References Cited

U.S. PATENT DOCUMENTS

| 4,420,385 | 12/1983 | Hartsough ...................... 204/298 X |
| 4,626,336 | 12/1986 | Bloomquist et al. ................ 204/298 |

FOREIGN PATENT DOCUMENTS 57-161065  10/1982  Japan .

*Primary Examiner*—Nam X. Nguyen
*Attorney, Agent, or Firm*—Hill, Van Santen, Steadman & Simpson

[57] ABSTRACT

Thin layers are deposited on a substrate such as a silicon substrate in series of evacuatable chambers into each of which an inert gas is admitted. In the case of a reactive sputtering deposition, a reactive gas is also admitted. Contamination between neighboring chambers with the reactive gas is prevented, and the chambers are rapidly charged with new reactive gas to achieve a stable gas flow by providing an inlet system including a pair of shut-off valves, and a closable flow governor, the shut-off valves and the flow governor being actuated in synchronism.

3 Claims, 1 Drawing Sheet

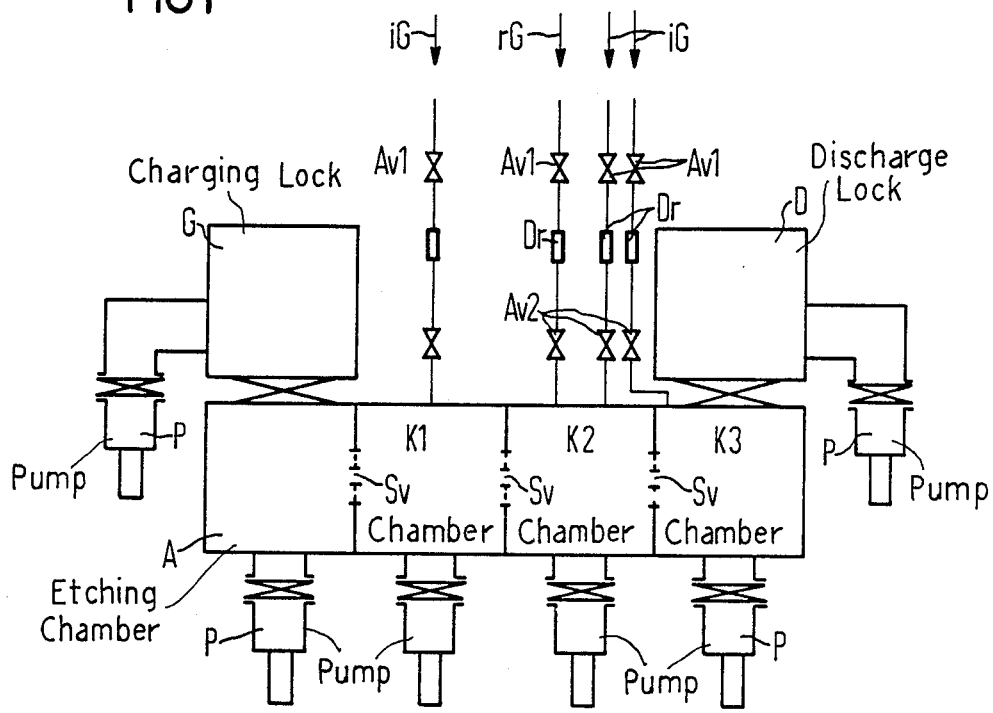
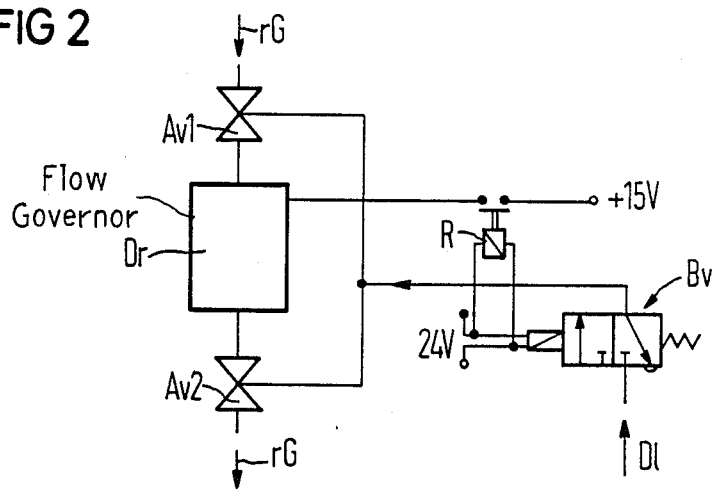

APPARATUS FOR APPLYING THIN LAYERS ONTO A SUBSTRATE

BACKGROUND OF THE INVENTION

1. Field of the Invention

The present invention is in the field of an apparatus for applying thin layers onto a substrate wherein the substrate is periodically conveyed between at least two evacuatable chambers in which an inert gas can be provided, with control means for preventing contamination between chambers.

2. DESCRIPTION OF THE PRIOR ART

In cathode atomization which is also referred to as cathode sputtering, atoms are stripped from a cathode in a vacuum by means of ions of an inert gas which are formed in a gas discharge. The atoms then deposit on a substrate located in opposed relation to the cathode. In a modification of this sputtering technique, in what is referred to as reactive sputtering, it is not the source material itself which is deposited but a compound which arises by reaction with a reactive gas.

Thin layers of titanium, titanium nitride, and aluminum are successively sputtered onto individual wafers in various chambers for the formation of contacts and interconnects in the manufacture of transistor megabit memories. Argon is normally introduced into the appropriate chambers as an inert gas in the sputtering of titanium and of aluminum, and nitrogen is used as a reactive gas so as to provide a reactive gas which is introduced into a treating chamber in the reactive sputtering of the titanium nitride. A feed of inert gas and of reactive gas occurs by means of a shut-off valve and a flow governor or regulator. In order to prevent a cross-contamination between the individual chambers of the sputtering apparatus due to the presence of the reactive gas, the reactive gas must be pumped off before the wafer transport takes place between chambers, and, in particular, before the slot valves between adjoining chambers are opened for the passage of wafers between chambers. When the next wafer is to be subsequently processed, a new supply of reactive gas must be introduced into the chamber in addition to the inert gas, and the gas flows must be stabilized. In view of the high vacuum of about $10^{-4}$ to $10^{-5}$ Pa required in the chamber, pumping the old reactive gas or the reaction gas mixture requires a relatively long time of several minutes. The admission and stabilization of the new reactive gas likewise requires an excessively long time in view of the required throughput.

SUMMARY OF THE INVENTION

The present invention provides an apparatus for depositing thin layers onto a substrate wherein pumping of the used reactive gas after the reactive sputtering as well as admitting and stabilizing the new reactive gas requires significantly less time than required heretofore.

In an apparatus of the present invention, there is provided a flow governor which is closable, the flow governor being connected in series with a first and second shut-off valve, the first shut-off valve, the flow governor, and the second shut-off valve being capable of synchronous closing.

Pumping old, reactive gas off is significantly accelerated by the second shut-off valve following the flow governor and located immediately preceding the treating chambers, since the evacuation of the line train up to the first shut-off valve and the evacuation of the flow governor itself are eliminated. This line train and the flow governor no longer have to be filled when admitting the new reactive gas. By itself, however, this improvement would not lead to the desired results since, with a simultaneous closing of the shut-off valves on both sides of the flow governor, the flow governor would effect a pressure rise preceding the second shut-off valve as the result of its function as a control member. As a result, a pressure surge directed into the chamber would then occur when the shut-off valves are opened, the pressure surge potentially leading to an overload of the vacuum measuring systems and to a response of the overload protection, i.e., a shut-off of the apparatus. Such a pressure surge is, however, avoided in the present invention by making the flow governor closable and shutting off the flow governor simultaneously with the shut-off valves arranged on either side of it.

In a preferred embodiment of the invention, the two shut-off valves are pneumatically actuatable simultaneously. Compared to solenoid valves, such pneumatically actuable shut-off valves have the advantage that they do not become hot and thus loose their tightness. Leaking shut-off valves could lead to a contamination of the process gases. Moreover, an overloading of the circuit can be avoided when re-equipping a conventional apparatus by integrating pneumatic shut-off valves.

In a further preferred form of the invention, the inert gas is also introducible into the chamber by means of a first shut-off valve, a closable flow governor, and a second shut-off valve, the first shut-off valve, the flow governor and the second shut-off valve being synchronously closed. The advantages described in conjunction with the reactive gas inlet thus are also achieved for the inert gas. Such an arrangement is of considerable significance especially for a chamber provided for the reactive sputtering since the rapid stabilization of both gas flows permits the required ratio between reactive gas and inert gas to be achieved exactly.

BRIEF DESCRIPTION OF THE DRAWINGS

A particular embodiment of the invention is shown in the drawings and will be set forth in greater detail below. In the drawings:

FIG. 1 illustrates an apparatus for applying thin layers onto a substrate in a highly simplified, schematic view;

FIG. 2 illustrates details of the control system for the reactive gas inlet into one of the chambers of the apparatus shown in FIG. 1.

DESCRIPTION OF THE PREFERRED EMBODIMENTS

FIG. 1 shows a highly simplified, schematic view of an apparatus for applying thin layers onto a substrate used, for example, in the manufacture of megabit memories and involving the application of titanium, titanium nitride and aluminum onto silicon wafers. The individual substrates pass through a charging lock G, an etching chamber A, a chamber K1 for sputtering a first thin layer, a chamber K2 for reactive sputtering of a second thin layer, a chamber K3 for sputtering a third thin layer and a discharge lock D. It will be seen that the charging lock G, the etching chamber A, the chambers K1 through K3 and the discharge lock D can each be individually evacuated by means of a schematically illustrated pump P whereby a high vacuum between $10^{-4}$ and $10^{-5}$ Pa as required is produced at least in the chambers K1 through K3. A slotted valve Sv is situated between the etching chamber A and the chamber K1, between the chamber K1 and chamber K2, as well as between chamber K2 and chamber K3. These slotted valves Sv, when opened, enable the passage of a wafer through the various chambers by means of a wafer transport system (not shown in detail).

An inert gas iG such as argon indicated by the arrows can be introduced into the chambers K1 through K3 by means of a first shut-off valve Av1, a closable flow governor Dr and a second shut-off valve Av2 in series. By means of a first shut-off valve Av1, a flow governor Dr and a second shut-off valve Av2, a reactive gas Rg such as nitrogen indicated by an arrow can also be introduced into the chamber K2.

FIG. 2 shows further details of the arrangement of the two shut-off valves Av1 and Av2 and of the flow governor Dr used for the admission of the reactive gas Rg. The same arrangement is used for the admission of the inert gas iG. It will be seen that a magnetically controlled actuation valve Bv in the form of a three/two way valve and a relay R can be simultaneously actuated by means of a control voltage of 24 V ac.

The actuation valve Bv controls the simultaneous actuation of the shut-off valves Av1 and Av2 with compressed air from a source D1, the shut-off valves being closed in their normal condition. The relay R actuates the normally closed flow governor Dr with an actuation voltage of +15 V dc to ground. It will be seen that the two shut-off valves Av1 and Av2 and the flow governor Dr can be synchronously closed or opened by application or removal of the control voltage of 24 V.

After the reactive sputtering in the chamber K2, the slotted valves Sv must be opened so that the substrate already treated in the chamber K2 can be transported into the chamber K3 and that a substrate treated in K1 can be transported into the chamber K2. To prevent reactive gas rG from proceeding into the chambers K1 and K3 during the transport operation, the further feed of reactive gas rG into the chamber K2 is interrupted before the opening of the slotted valves Sv. This is accomplished by simultaneously closing the appropriate shut-off valves Av1 and Av2 and the appropriate flow governor Dr. Simultaneously with this operation, the further feed of inert gas iG into the chamber K2 is also interrupted by simultaneously closing the appropriate shut-off valves Av1 and Av2 and the associated flow governor Dr in the inert gas line feeding chamber K2. Only after the reaction gas mixture present in the chamber K2 has been pumped off by means of the pump P are the slotted valves Sv for the transport of this substrate then opened. After the transport of the substrates and after the subsequent closing of the slotted valves Sv, all shut-off valves Av1 and Av2 and flow governors Dv are again opened, so that a rapid stabilization of the two gas flows is achieved while avoiding a pressure surge. The introduction of inert gas iG into the chambers K1 and K3 is controlled in the same way.

The apparatus for applying thin layers onto a substrate set forth above with reference to FIGS. 1 and 2 may involve a sputtering system such as model MCH-9000 of ULVAC Corporation, of Kanagwa, Japana that was modified in relation to the gas admission system of the present invention. A "FC-280-S Ultrafast Flow Controller" of Tylan GmbH, D-8057 Etching, was used as the flow governor Dr and pneumatic valves known as "Nuproventil SS4 BK-1C" of Druckluft Ebel, D-8033 Martinsried, Germany, were used as shut-off valves Av1 and Av2 for this modification.

It will be evident that various modifications can be made to the described embodiments without departing from the scope of the present invention.

We claim as our invention:

1. An apparatus for depositing thin layers onto a substrate which comprises:
   at least two evacuatable chambers,
   first inlet means for introducing an inert gas into at least one of said chambers,
   second inlet means for introducing a reactive gas into another of said chambers,
   said second inlet means including, in series:
      a first shut off valve,
      a closable flow governor,
      a second shut-off valve, and
      actuating means for closing said first shut-off valve, said flow governor, and said second shut-off valve in synchronism.

2. An apparatus according to claim 1 wherein said actuating means is pneumatically energized.

3. An apparatus according to claim 1 in which both said first inlet means and said second inlet means are equipped with said first shut-off valve, said flow governor, said second shut-off valve, and said actuating means.

* * * * *